United States Patent [19]

Jarvis

[11] Patent Number: 4,733,292
[45] Date of Patent: Mar. 22, 1988

[54] PREPARATION OF FRAGILE DEVICES

[75] Inventor: Charles R. Jarvis, Hockley, United Kingdom

[73] Assignee: The General Electric Company p.l.c., London, England

[21] Appl. No.: 893,872

[22] Filed: Aug. 6, 1986

[30] Foreign Application Priority Data

Aug. 6, 1985 [GB] United Kingdom ............... 8519710

[51] Int. Cl.$^4$ ............... H01L 23/48; H01L 29/46; B44C 1/22; C23F 1/02
[52] U.S. Cl. ............... 357/70; 29/827; 156/630; 156/634; 156/651; 156/656; 156/661.1; 156/902; 361/421; 437/220
[58] Field of Search ............... 29/827, 576 S; 361/421; 357/70; 156/630, 634, 651, 654, 656, 659.1, 661.1, 901, 902; 437/220

[56] References Cited

U.S. PATENT DOCUMENTS

| | | | |
|---|---|---|---|
| 3,532,802 | 10/1970 | Spall | 156/901 X |
| 3,539,259 | 11/1970 | Hillman et al. | 174/52 X |
| 3,711,625 | 1/1973 | Dupuis | 174/52 PE |
| 3,795,044 | 3/1974 | Peltz | 156/661.1 X |
| 4,404,059 | 9/1983 | Livshits et al. | 156/651 X |
| 4,510,017 | 4/1985 | Barber | 156/651 |

FOREIGN PATENT DOCUMENTS

2025129A 6/1979 United Kingdom .

*Primary Examiner*—William A. Powell
*Attorney, Agent, or Firm*—Spencer & Frank

[57] ABSTRACT

A method of fabricating a generally planar device such as a lead frame, having fragile portions contiguous respectively with relatively robust portions, which includes in sequence, the steps of providing a robust, generally sheet-like blank, removing material from selective portions of a surface layer of the blank at one of its main surfaces to define first portions of the surface layer to be the relatively robust portions in the finished device and second portions to be fragile portions of the finished device, firmly embedding the second portions in a fixing material layer, and removing material from the other main surface of the blank in the region of the embedded portions to a sufficient depth to expose an underside of the surface layer, thereby to isolate the embedded portions from each other and to render them thinner and thus more fragile than the first portions. With such a method, there is fabricated a generally planar lead frame including several leads, each having a relatively robust portion and a contiguous, relatively fragile portion thinner and more narrow than the robust portion, the fragile portion having a flat face. The lead frame further includes a flat support in the plane of the lead frame, all of the fragile portions being embedded in the flat support such that only the flat face of each fragile portion is exposed in the plane for electrical contact, and each fragile portion is as wide at the flat face as it is beneath that flat face.

13 Claims, 7 Drawing Figures

PREPARATION OF FRAGILE DEVICES

BACKGROUND OF THE INVENTION

This invention concerns the preparation of fragile devices by the removal of part of a suitable body of material (by an etching or similar removal process), and relates particularly, though not exclusively, to the formation of lead-frames useful inconnection with the packaging of micro-electronic devices such as integrated circuits.

The main concept of the invention is conveniently described with reference to lead-frames.

As is now well known it is possible to manufacture very complex electronic circuits in the form of "chips", in which the circuit—containing both passive components, such as conductors, resistors and capacitors, and active components, such as diodes, transistors and other semi-conductor devices—is formed on and in the surface of a fingernail-sized chip of silicon. In a Large Scale Integrated device the number of connections in and out of the chip may well be at around the hundred mark, but frequently chip designers are pressing for lead counts of a much greater value—possible as high as 400. To fit these in within the available space, the actual conductors forming these connections have to be only about 1 thou (about 25 microns) wide; this is finer—and much more delicate—than the finest human hair.

Naturally, the chip, and its connectors, has to be protected, and it is common to encase, or package, the chip, usually in a plastics or ceramic material, to make a larger, stronger article which may relatively safely be handled during the construction of the device of which the chip forms a part. One possible end result is the familiar Dual Inline Package (DIP), and oblong object the size of a LEGO brick with conductor "legs" extending downwardly therefrom along either side by which the DIP may be connected onto a Printed Circuit Board (PCB) via holes therein. Another—frequently used where the number of connectors to the chip is large—is the Flat Pack (FP), a square object that has its legs on two or all four sides and extending below and then outwardly so that it can sit on the PCB with its legs flush with, and soldered to, the tracks on the board's surface. Such a result (the DIP or FP) is preferably achieved by packaging the chip together with what is called a "lead-frame" (a framework of "radially" extending conductive leads that are very fine and fragile on the inside, where the 25 micron connectons are made from them to special pads on the chip itself, but are much coarser, and more robust, on the outside, where the connections are made to the PCB). The invention is concerned with the preparation of fragile bodies like this lead-frame.

It is common practice to construct a lead-frame by starting with a foil or sheet blank of relatively thick, robust material (robust enough to make the legs of a DIP or FP, say), and to remove this material, often by etching, where it is not required at all (the empty spaces between legs). Unfortunately, the sheer quantity of material to be removed, coupled with the very significant problems of controlling the removal process so as to remove only what is required to be removed, means that it is very difficult to start with a thick and robust foil and end with a lead-frame the inner parts of which are sufficiently narrow and delicate. In one conventional method. quite suitable for making a Flat Pack lead-frame with only a few—say, four or five—connectors per side (making 16 or 20 in all four sides), the lead-frame blank is masked on either major face so as to define those areas wanted (the connectors, together with a few temporary sections holding the whole together) and unwanted (the spaces between connectors together with the central area where the chip will be), and placed in a bath of chemical etchant material until all the unwanted material has been etched away. The result is a "skeleton" of conductors uniformly as thick as the original sheet (typically 0.1 mm—100 microns—or so) but wider on the outside (perhaps 1 mm—1000 microns) than on the inside (possibly 0.3 mm—300 microns). With a low lead count it is acceptable to form these inner leads with their inner ends free, for their thickness and width make them reasonably rigid. However, with a higher lead count—say 20 to 25 connections per side (making 80 to 100 in all) this is unacceptable, and it is necessary to leave unetched a central, lead-retaining, portion to which each fine lead end is attached by a very narrow neck, then to "fix" the leads by a packaging operation, and finally to chop away the lead-retaining portion (through the narrow necks) so as to leave the tips of the leads free and ready to be connected to the relevant chip pads. Unfortunately, with a lead count that is higher still—say, 50 connections per side (making 200 in all)—it becomes necessary to reduce the width of the individual leads at their "fine" end to as little as 0.05 mm (50 microns), and the sheer mechanics of fixing such fine leads, and then chopping away the lead-retaining portion, becomes almost impossible to manage. The invention of the copending British Application for Letters Patent No. 8519709 which has been assigned to the assignee of the invention and whose disclosure is incorporated herein by reference. seeks to mitigate the problems by providing the "fixing" support for these very fine leads not after they have been formed but before. More specifically, this other invention suggests a technique whereby most of the thickness of the material over the whole of the lead-frame foil blank's inner area (where the inner connections to the chip will eventually be) is removed from one face to make a generally robust foil with a centrally-located recess defining a much thinner inner section, the recess is filled with some "fixing" material that will both provide support for and hold in position the thin inner section, and further material is then removed from the other face of the blank so as to form the fine inner parts of the lead-frame, these being firmly supported, and held in place, by the "fixing" material filling what was the recess in the foil. Such a technique is, of course, applicable to the preparation of many devices in which a fragile area is formed by the removal of a part of a more robust area.

The invention the subject of this other Application is defined as a method of fabricating a generally planar, sheet-like, device having a first, robust, area and, contiguous therewith, a second, fragile, area to be constructed by removal of some of the material of which the device consists, in which method:

(a) starting with a corresponding generally planar, sheet-like blank, in which both first and second areas are robust, some of the material to be removed from the blank to make the second, fragile, area is so removed from one major face of the blank, to form a recess in the blank;

(b) the thus-formed recess is filled with a fixing material, so as to support and fix in place the thin area of blank material constituting the base of the recess; and thereafter (c) the remainder of the material to be removed from the blank to make the second, fragile, area is so removed from the other major face of the blank, so forming the required second, fragile, area supported and fixed by the fixing material and contiguous with the first, robust, area.

Unfortunately, though this defined method does enable there to be prepared devices of the type specified, and specifically to allow there to be formed by a through-mask ethcing process lead frames having extremely fine inner leads occupying the second (fragile) area, nevertheless it does suffer from one minor disadvantage for this particular use, which disadvantage arises because of the occurrence of mask undercutting during the stage of etching from the other major face. The problem can be explained as follows:

The preferred technique (using this other invention) involves removing material from the blank by an etching process, specifically a chemical etching process. In this process the blank is first coated with a masking layer, that covers the areas not to be etched away, and is then contacted with the etch solution. Naturally, the etching occurs only where the blank material is exposed—and at first this is indeed the surface. However, as the etching progresses, cutting a deeper and deeper "groove" (into the blank material) bounded by "walls" of blank material underlying, and thus protected by, the mask, so the etchant attacks not merely the "floor" of the groove but also these very walls. Thus, the etch process eats "sideways" into the blank material into the areas beneath the mask, so undercutting the mask. Of course, the degree of undercut depends on a number of factors, including the detailed crystolographic structure of the blank material and the physical way in which the enchant is allowed to contact the surface; it is common, however, for the unwanted undercut to be about half the depth of the desired etching. The net result, though, is that when the mask is removed the fine leads produced by the etching process have quite substantial, wide, bases (where little sideways etching occurred), but have extremely narrow tops (where the maximum undercutting took place). And most unfortunately it is to these tips that there must be bonded the wires connecting the leads to the chip to be mounted in the lead frame; as can be imagined, bonding these wires to leads each of which have half—or less—than the thickness they should have is quite difficult.

The present invention seeks to solve this problem by the extremely simple, but nevertheless very effective, expedient of, as it were, performing the method of this other invention in reverse—that is to say, not of first removing material from one face of the blank to form a recess, and then removing the remainder of the material from the other major face, but instead of first removing material to define the components of the proposed fragile area of the blank, supporting these with fixing material, and then removing the remaining material (to make a recess) from the other face. In this way, when using the method to make by etching the fine inner leads of a lead frame, it is the wide bases of the leads that are revealed and to which the wire connections may be bonded, rather than the "undercut" upper surfaces.

In one aspect, therefore, the present invention provides a method of fabricating a generally planar, sheet-like, device having a first, robust, area (portion) and, contiguous therewith, a second, fragile, area (portion) to be constructed by removal of some of the material of which the device consists, in which method:

(a) starting with a corresponding generally planar, sheet-like blank which can be thought of as consisting of two layers—a surface layer and a base—so that of the two major surfaces of the blank, one is formed on the base, the other on the surface layer, and in which both first and second areas are robust, some of the material to be removed from the surface layer of the blank to make the second, fragile, area is so removed from one major face of the blank over a proportion of its thickness, to form fragile components in the second areas upstanding from, and supported by, a remaining base of the blank material, (b) the thus-formed components (those portions of the) are intimately surrounded by a fixing material so as to be firmly embedded therein, so that the fixing material supports and fixes the component in place, and thereafter;

(c) the remaining base from which the fragile components are upstanding is removed from the other major face of the blank to leave the components separated from each other, to form the required, second, fragile area having fragile portions supported and fixed by the fixing material and contiguous with portions in the first, robust, area such that each component which is formed by the removal of the base has a wide exposed surface.

The method of the invention can, as stated hereinbefore, be applied in the fabrication of numerous types of device, and examples of these are contact sets for electrical switches, and positional sensors. Nevertheless, it is especially suited to the manufacture of lead-frames, as described above, and is for the most part discussed further hereinafter with reference to such a use.

The inventive method is used in the formation of a generally planar (that is to say, flat), sheet-like, device, and starts with a corresponding generally planar, sheet-like, blank. This blank is a sheet, or foil, of material—thus, an article having an area (and length and breadth dimensions) large relative to its thickness, and so has two major faces (the two "sides" of the sheet).

The material of which the blank is constituted naturally depends upon the nature of the device to be made. For a lead-frame the material must be an electrical conductor, especially one that is sufficiently malleable to allow itself to be shaped by a bending operation (subsequent to the method of the invention the robust area of the blank will be made into the "legs" of the package, and will need to be bent—and perhaps re-bent—out of the sheet plane and into the correct shape). Typical lead-frame materials are made of a suitable metal; nickel-iron alloys of the KOVAR or INVAR type are very suitable, as are copper and copper-based alloys such as beryllium-copper, phosphor bronze (an alloy of tin and copper with up to 0.5 wt % phosphorus) and copper-iron-phosphorus alloys like OLIN 194.

The device to be fabricated is one having a first area that is robust and—contiguous therewith (and probably wholely surrounded thereby)—a second area that is fragile. The two terms "robust" and "fragile" are used in a fairly relative sense—the "fragile" area is one that is significantly less robust than the robust area, and vice versa—though where a lead-frame is concerned the "robust" area ends up as the "legs" of the final package, tough enough to withstand handling, while the "fragile" area ends up as extremely fine conductors rather more delicate than human hair.

The method of the invention involves removing material from the second area of the blank (and so making that area fragile). Naturally, the distribution of this removal—where, and how much, material is removed—depends the type of device. For a lead-frame, however, there are two distinct classes of material to be removed. One is material removed simply to "thin" the sheet over the whole of the defined, second, area, so that it becomes more suitable for forming into the inner leads of the lead-frame. The other is material removed from between those portions that are to be the leads, so separating each lead from its neighbours. In the first stage the between-lea blank material is removed from one of the blank's major faces, so leaving the formed leads flush with this major face, and standing proud from the remaining "thickness" of the blank (which therefore constitutes a base carrying the formed leads), while in the second stage that base is removed from the other major face, so ending with the leads in this area having a depth equal to roughly half the blank's original thickness.

Removal of material from the blank is accomplished by any technique suited to the intended device. Thus, the methods of removal include particle ablation and laser trimming, but—especially for lead-frames—chemical etching is the preferred technique. Of course, in this latter case the nature of the etchant will be chosen to fit the blank material; the methods are well known in the Art, and need no detailed comment here—though it may be useful simply to note that nickel iron alloys can best be etched by ferric chloride/hydrochloric acid mixtures, or nitric acid-based materials, while copper and its alloys are preferably dealt with using either ferric chloride or ammoniacal cupric chloride (REGENEX, for instance). It is also worth pointing out that etching (and, indeed, other techniques of material removal) has to be done selectively—some areas are to be removed, some not—and a convenient way to arrange this is to "mask" the areas not to be etched with a protective coating that is unaffected by the etchant to be employed. Within reason—as explained hereinbefore a degree of "undercutting" of the mask is, unfortunately, inevitable, and is the greater as the depth of the etching increases—this masking ensures that only the unmasked, exposed, areas are etched away.

In the first stage of the method of the invention material is removed from the second area of the blank (that area destined to become the fragile area of the device), to leave the intended fragile components upstanding from, and supported by, a base constituted by second area blank material that has not been removed. Thus, where in the final device, there is to be no blank material, then in those areas the material is removed—but only to a depth that is a fraction of the thickness of the blank, so that those parts of the blank that will eventually form the fragile components are left upstanding/-projecting from a "base" of the remaining thickness of the blank. The actual disposition of the material to be removed will, naturally, be appropriate to the device being fabricated; for a lead-frame it is that material lying between the portions defining the inner leads, the intended fragile components being these inner leads themselves.

At the same time as material is removed from the second area of the blank it is, of course, possible to remove material from the first area (the area destined to become the robust area of the device). For example, when the device is a lead-frame it is naturally a requirement that the robust area end up as leads the outer part of which make the legs of the final package, so that somewhere along the way there must be removed from the blank's robust area all the material between those portions destined to be these leads. At least some of this surplus material can, then, be removed at the same time as the second area is thinned (when using a through-mask etching technique this is arranged quite simply by so designing the mask that the "between-leg" portions remain exposed). Over the whole of the first area the between-leg portions are consequently subjected to the same thinning as that effected to the second area, and this is in fact particularly advantageous because (as described further below) it greatly reduces the degree of undercutting of these leg portions as compared with a process wherein all of the depth of the between-leg portions is removed at one go.

Having removed material from the second area of the blank the method of the invention results in the intended fragile components being upstanding from a base. The material forming this base will, in the second stage, be removed to leave the fragile components free, so forming the final, fragile area—which, in a lead-frame, is the assembly of inner leads. However, because this final form is so fragile it is desirable to support the whole area before the second stage removal is effected, and this is done, in the method of the invention, by filling the gaps between the upstanding fragile components with a fixing material that will, as required, support and fix them in place. This fixing material can, naturally, be any appropriate to the circumstances——and, where it is not to be removed after the second stage material removal has occurred, but is to stay as a part of the final device (as is preferred where the device is a lead-frame), this fixing material will also be appropriate to the type of device. A lead-frame device is to be packaged with an electrically-insulating packaging material; conventional packaging materials are plastics (such as silica-filled epoxies like POLYSET 410B and NITTO HC10 type 2) and ceramics (such as alumina and beryllia), and clearly the fixing material should be compatible with the packaging material. Fixing materials compatible with one or other plastics packaging material are generally the thermosetting resins, specifically the epoxies (such as those named above) while those compatible with one or other ceramics packaging material are generally glasses and glass-ceramics.

The actual mode of emplacement of the fixing material may be whatever is appropriate. For example, a fixing material that is a polymerised plastics might be "injected" or "squeezed" into place in the form of a pasty but flowable pre-polymer mixture (the final polymerisation then taking place in situ); a thermoplastics fixing material might even be "melted" into place. Similarly, a glassy fixing material might likewise be applied, in an un-fired form, and then fired in situ. In one preferred case the fixing material is a glass-like lithium alumina silicate, and is deposited in a glassy state and fired in situ to convert it to a glass-ceramic state.

As intimated above, the fixing material either may be removed at some later stage or may be left in place serving some useful function.

Once the inter-fragile-component spaces have been filled with the fixing material, the material constituting the supporting base of the fragile components is removed from the other major face. As in the case of the removal of blank material in the first stage, the removal technique may be any appropriate, as described above.

Moreover, as in the first stage, blank material can be removed not only from the second area but also from the first area. For example, to make a lead-frame half the thickness of first area material in the between-leg portions is removed (from one major face) in the first stage, and the rest—so separating the "legs" one from another—is removed (from the other major face) in the second stage.

Any "masking" techniques required, particularly to ensure registration of wanted and unwanted portions on one face with the corresponding wanted and unwanted portions on the other face, are well known, and need no comment here.

Having removed blank material in the second area both from one major face, and then, after supporting the formed fragile components, from the other major face, the device is complete. If it is a lead-frame, for example, it can then be used—a chip can be mounted in the centre of the second, fragile, area surrounded by the free ends of the fine inner leads (this central portion will normally have been removed, either during the etching process or by some appropriate alternative method, perhaps as a preliminary measure), these leads can be connected (by wire-bonding, perhaps) to the relevant chip pads, the whole may then be encased in some suitable protector material (often by placing it in a small "box" sealed with a separate lid), but with the remains of the robust blank area—the "leg" portions—projecting therefrom and ready to be bent or otherwise mechanically shaped into the desired "leg" form. Alternatively, the lead-frame may be incorporated within an empty, chip-less open-top package (so that at some subsequent time the chip may be inserted into place and its pads connected up to the inner leads, and a lid attached and sealed shut). The process of making such a device is described hereinafter in more detail with reference to the accompanying Drawings and the Examples. It is here useful to note that the lead-frame as first constructed commonly has integrated therewith a whole series of strengthening and retaining members (some of which may be of a plastics, or other non-conducting substance, that is laid in place after the first face treatment but before the second face treatment), together with a series of test points conductively connected to the "leg" portions; some of these extra features of the lead-frame are removed once the completed chip-containing package has been made, while others are removed after the package and its contents have been tested.

The invention extends, of course, to a device, particularly a lead-frame, whenever fabricated by the method of the invention.

Various embodiments of the invention are now described, though by way of illustration only, with reference to the accompanying drawings in which:

FIGS. 1A, B, C and D form a sequence of perspective, diagrammatic, views showing symbolically the application of the method of the invention;

FIGS. 2A, B and C form another sequence of perspective, diagrammatic, views showing the various stages in the application of the inventive method to the fabrication of a leadframe.

Figure 5:
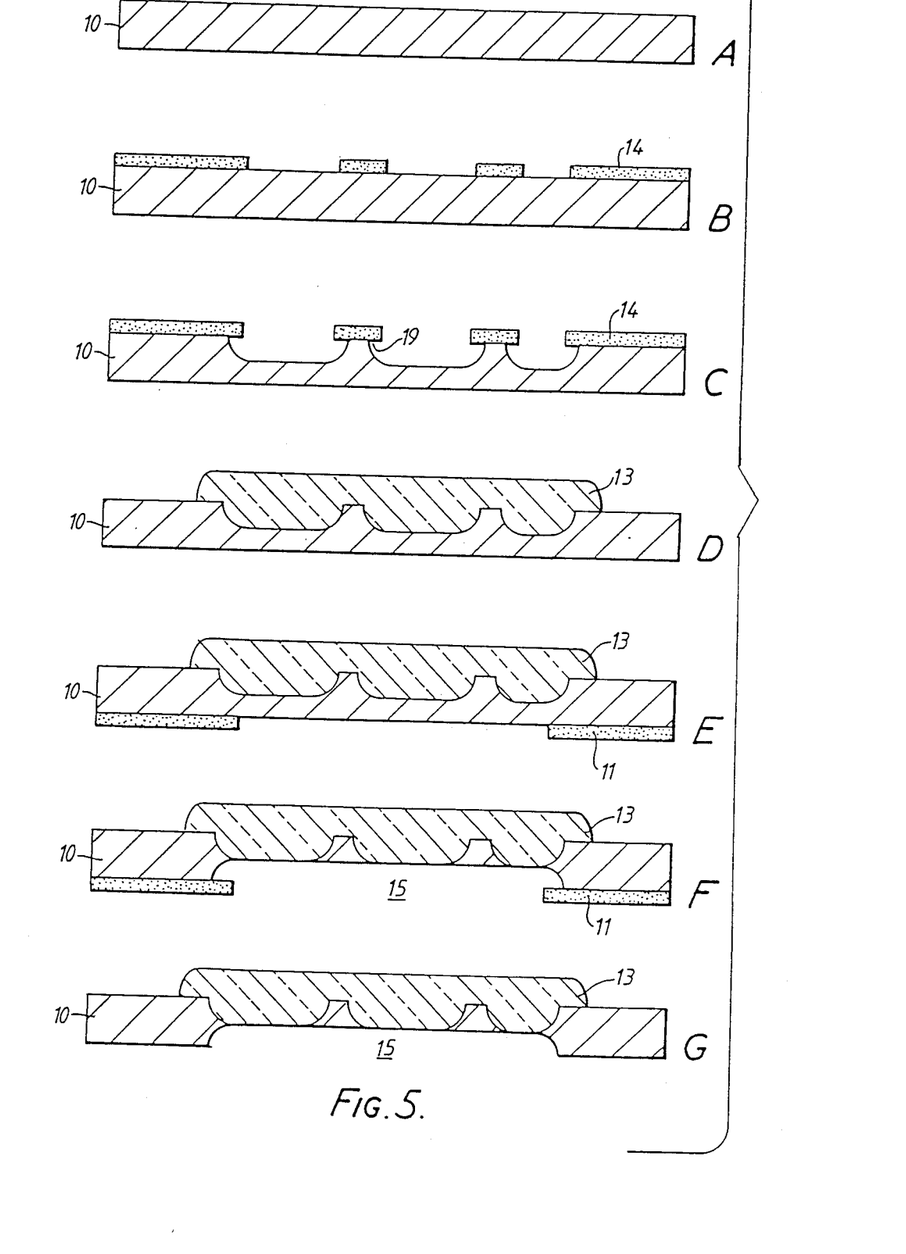
FIGS. 5A to G form a sequence of sectional, diagrammatic, views showing symbolically the application of the method of the invention.

It is convenient first to consider the sequence of operations illustrated by the FIG. 5A to G series. It is generally as follows:

(A) The starting point is a blank (10)—a sheet of the appropriate material (in a leadframe this would be a conductive metal such as NILO K).

(B) The blank is protected on one surface—the upper surface as viewed—with a mask (14) defining the form of the required fragile area. In a leadframe this area would be that containing the fine inner leads.

(C) Blank material is removed, through the mask, to roughly half the blank's depth. Undercutting (as 19) takes place.

(D) After removal of the mask (not shown separately) the thus-formed fragile area is encapsulated with fixing material (13). When making a lead frame this material is conveniently a non-conductive glass.

(E) The lower surface (as viewed) of the blank is now protected with a second mask (11) defining the area that is about to be transformed into the desired fragile area.

(F) Blank material is removed, through this second mask, right "down" to the fixing-material-supported parts of the fragile area (the leadframe's fine inner leads), so forming the desired fragile area (generally 15) supported by the fixing material 13.

(G) The mask is then removed.

Figure 1:
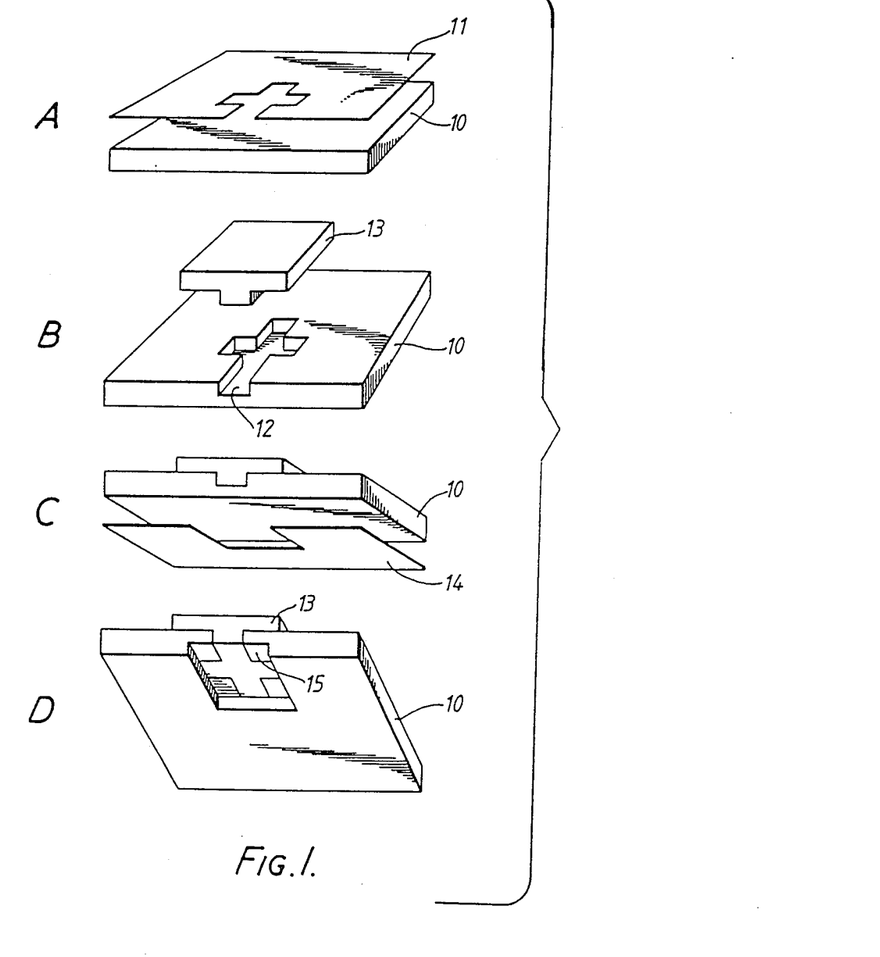

The sequence of operations illustrated by the FIGS. 1A, B, C and D series is generally as follows:

(A) a planar, sheet-like blank 10 of leadframe material that is overall of a robust construction is protected on one surface (the upper surface, as viewed) with a mask (11) defining the form of the required fragile area.

(B) Blank material is then removed, through the mask, to a depth of roughly half the blank's thickness, so forming a recess (12) in the upper surface, and this recess is then filled with sufficient fixing material 13 to support both the fragile area formed in the final stage, and the immediate surrounds thereof.

(C) The lower surface (as viewed) of the leadframe blank is now protected with a second mask 14 defining the whole of the area which is to be transformed into the required fragile area.

(D) Blank material is then removed, through this second mask, right through to the fixing-material-filled recess 12, so forming the desired fragile area 15 supported by the fixing material 13.

Figure 2:
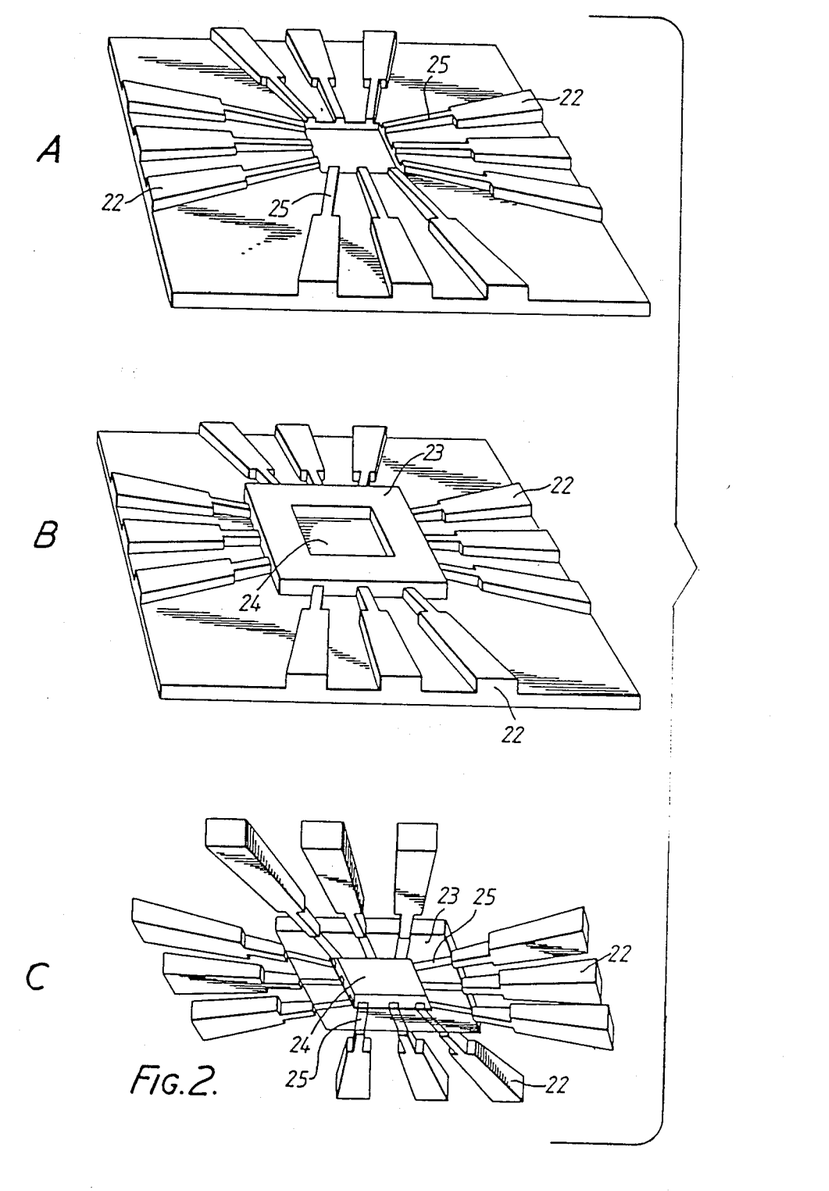

FIGS. 2A, B and C are a series of perspective views from above (A and B) and from below (C) showing various stages in the formation of a leadframe. FIG. 2A depicts the stage after removal of blank material from one major surface so as to define the fragile inner leads (as 25). At the same time, there is removed half the thickness of the blank material elsewhere—the between-leg portion—so as to form in part the outer leads/legs (as 22) of the desired leadframe. In FIG. 2B there can be seen in place the fixing material (23), which takes the form of a square "ring" of material moulded snugly over the inner leads and leaving a chip-sized central area (24) unfilled. Finally, FIG. 2C shows from below (as viewed) the leadframe after the remaining unwanted blank material has been removed. From this Figure it will be clear how the fragile inner leads 25 are safely supported by the ring of fixing material 23 while the outer leads 22 now stand free, and support themselves.

Figure 3A:
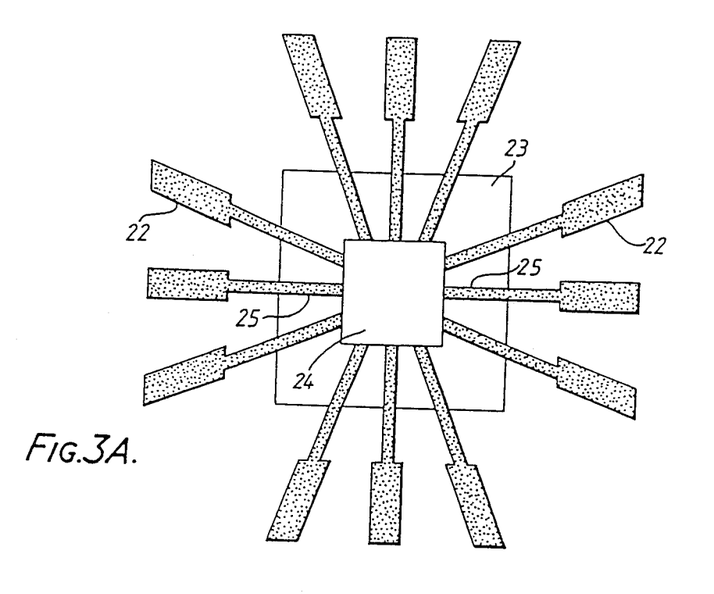
FIGS. 3A, B and C show three "plan" views of three leadframe layouts before actual use.

The views of FIGS. 3A, B and C are top plan views of three different lead frames. That of FIG. 3A corresponds to the leadframe of FIG. 2C, that of FIG. 3B relates to a yet more realistic leadframe, while that of FIG. 3C is a slightly enlarged view of a real leadframe.

Figure 3B:
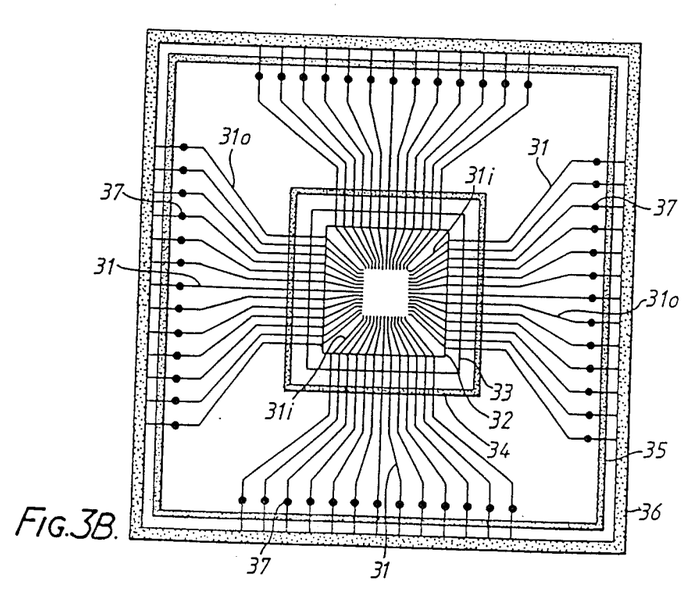
Figure 3C:
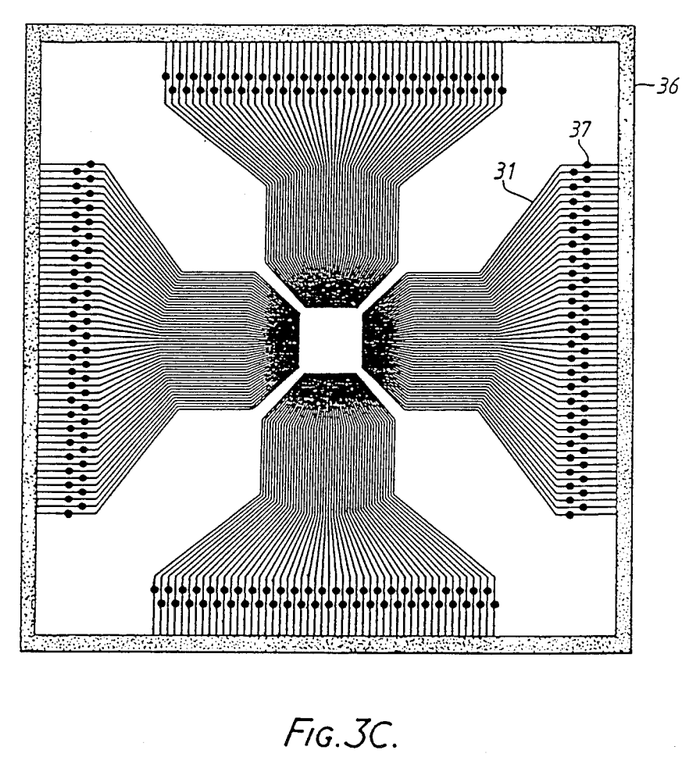

The leadframe of FIG. 3B is a four-sided device with 13 leads (as 31) a side (making 52 leads in all). Each lead has a fine, fragile, inner portion (as 31$i$) and a relatively robust outer portion (as 31$o$). Within the general area of the inner leads 31$i$ there is a square ring-like lead support (of lead fixing material) whose inner edge is defined by the inner tips of the leads and whose outer edge is shown by the perimeter line (32). Further out from this perimeter is a line (33) indicating where the boundary of the package, forming the desired flat pack, will lie, and just beyond this is a first lead support ring (34) of a nonconductive plastics. Much beyond that, in the robust outer lead area, is a second non-conductive lead support ring (35), and beyond that still is a peripheral band of leadframe blank material (36) temporarily holding the outer ends of the leads together in registration. Finally, just within the second support ring 35 each lead widens into a test contact portion (as 37).

The preparation of the leadframe of FIG. 3B is as follows. First, from one major side of a blank, there is removed, to half the depth of the blank, all the material between both the inner leads and the outer leads/legs, save for the outer ring 36. Next, the fixing-material inner ring (like 23 in FIG. 3A) is placed in position. Then, all the rest of the blank material between the outer leads/legs, and all the remaining material within the recess periphery (as defined by line 32) is removed from the other side. The finished lead-frame may then be attached to the material which serves as the base of the flat pack. Finally, after possibly bending the leads into the shape required for use, the two support rings 34, 35 are placed in position.

At this stage, a chip may be mounted and connected up to the leadframe, the outer blank material ring 36 may be cut off, and the correct working of the chip tested by signals and power sent in and out via the test pads 37; a protective covering may be added; and finally the leads may be cut just outside the first support ring 34 and bent (if not already done) into the required shape for use.

FIG. 3C shows, slightly enlarged, the lead layout of a real leadframe. It is comparable to FIG. 3B without the latter's two non-conductive support rings, but has 50 leads a side (making 200 leads in all).

Figure 4A:
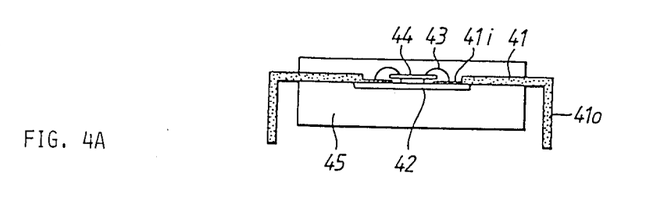
FIGS. 4A, B and C show respectively end elevation see-through, perspective and top-plan see-through views of a DIP employing a leadframe fabricated according to the invention.
Figure 4B:
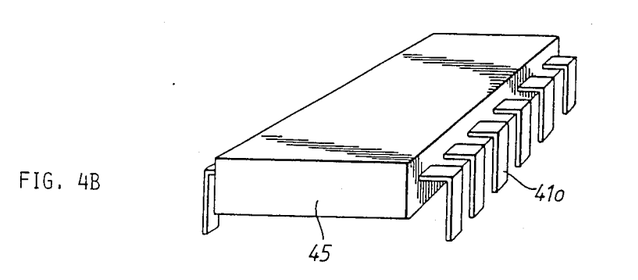
Figure 4C:
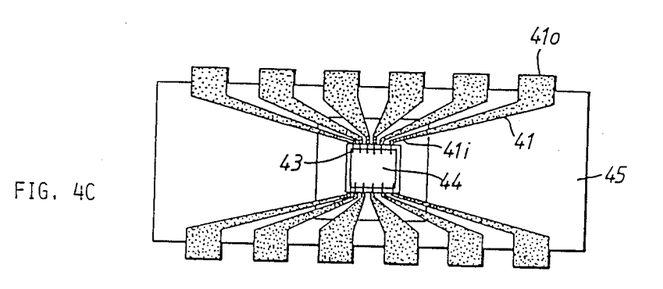

Finally, the sequence of FIGS. 4A, B and C shows various views of a simple Dual Inline Package using a leadframe fabricated in accordance with the invention. FIG. 4B gives a general, perspective view from above, while FIGS. 4A and B are respectively a see-through end elevation and a see-through top plan. From these two see-through views it will be apparent that the leadframe has 12 leads (41, 6 on each of the two opposed long sides) that each have a fragile inner portion (41$i$) and a robust outer portion (41$o$). The inner portions 41$i$ are supported by a "slab" (42) of fixing material, and mounted on that, and connected by wires (as 43) to the inner portions 41$i$, is the chip (44). The whole is encased in a protective package (45), with the ends of the lead outer portions 41$o$ projecting therefrom to form legs.

The following Example is given, though again by way of illustration only, to show details of one preferred method of the invention.

EXAMPLE: PREPARATION OF A LEADFRAME

Stage 1 Preliminary Preparation of the Leadframe Blank

In the normal way a 0.1 mm sheet of NILO K (an alloy of 54 wt % iron, 29 wt % nickel and 17 wt % cobalt) was cut to size, pierced with the requisite tooling/locating apertures, and then vapour degreased to remove its oily protective coating. The surface was then de-oxidised and slightly roughened (abraded) by passing it through a conventional pumice jet scrubber.

Stage 2 First Masking and Etching

Using a standard dry film resist laminator, a 0.025 mm layer of a UV-sensitive photo-resist (Dupont's RISTON, a polyvinyl-glycidyl acrylate) was applied to each side of the blank. The coated blank was then located in an imager (a Dupont PC Printer Lightbox), and exposed for a suitable intensity/time to UV light through an appropriate artwork master mask, causing partial polymeration of the unshielded resist layer areas. After removal of the unexposed (unpolymerised) resist, by passing the blank through a resist developer containing CHLOROTHENE (a trichloroethane-based solvent), the remaining resist was baked at 80° C. (to complete the polymerisation). The thus-masked blank was then spray etched, using a conventional ferric chloride etchant at 30° C. for sufficient time (a few minutes) to allow the etchant to penetrate about 0.05 mm—half the blank thickness—into the blank material. After washing, the remaining resist was then removed by passing the blank through a bath of SYNSTRYP solvent (based on dichloromethane). At this stage the blank had the complete lead pattern—both the larger outer leads and the very much finer inner leads—etched on one side to a depth halfway through the material.

Stage 3 Glassing the Fine Inner Leads

In order to enhance the adhesion of the subsequent glass material to the leadframe, a "furnace oxide" coating was then formed on the blank surface by heating the blank in nitrogen with some oxygen in a furnace to around 900° C. over a period of half an hour. Then, using a graphite frame to locate and contain it, a finely powdered lithium aluminosilicate glass was applied to the half-etched fine inner lead area of the blank and fixed into place by fusing in a furnace to about 900° C. In this way the glass flowed around, and "encapsulated", the fine leads.

Stage 4 Second Masking and Etching

After deoxidising the blank (by a 5 minute dip in 50% hydrochloric acid at 65° C.), the techniques described in Stage 2 above were used to form a photoresist coating on the non-glassed surface, convert this into an appropriate etch-resistant mask (the glassed surface was additionally given an etch-resistant coating of Robertsons Chemicals' Resist 1993, an air-drying liquid resist), etch away the unwanted blank material (so defining the "bottom" half of the large outer leads, and removing all the material in the area "underneath" the fine inner leads), and remove the residue of the photoresist coating. The result was the desired leadframe, having large, self-supporting outer leads having a depth equal to that of the original blank and being integral with the glass-supported fine inner leads having half that depth.

I claim:

1. A method of fabricating a generally planar device having fragile portions contiguous respectively with relatively robust portions, comprising, in sequence, the steps of:
   (a) providing a robust, generally sheet-like blank having opposite main surfaces;
   (b) removing material from selected portions of a surface layer of the blank at one of the main surfaces, to define first and second remaining portions of the surface layer, the second portions to be the fragile portions of the finished device and the first portions being contiguous with respective ones of the first portions and to be the relatively robust portions in the finished device;
   (c) firmly embedding the second portions of the surface layer in a fixing material layer; and
   (d) removing material from the other main surface of the blank in the region of the embedded portions to a sufficient depth to expose an underside of the surface layer, thereby to isolate the embedded portions from each others and to render them thinner and thus more fragile than the first portions.

2. A method as in claim 1, wherein the planar device is a lead frame of which each fragile, second portion and its corresponding relatively robust first portion together constitute a lead, and the step of removing material from the surface layer of the blank comprises the step of defining a lead pattern for the device.

3. A method as in claim 2, wherein the step of providing a blank comprises the step of providing a blank formed from a material selected from the group of materials consisting of nickel-alloys, copper and copper-based alloys.

4. A method as in claim 2, wherein the steps of removing material include the step of forming each first portion as a leg which is tough enough to withstand handling, and forming each embedded portion as an extremely fine conductor finer than human hair.

5. A method as in claim 2, wherein the steps of removing material include the step of forming each first portion as a leg which is tough enough to withstand handling, and forming each embedded portion about 25 microns wide.

6. A method as claimed in claim 2, wherein said step of removing material from the other main surface includes the step of removing material to a depth equal to roughly half the original thickness of the blank, so that the embedded portions, constituting inner portions of the leads, have a thickness roughly half the original thickness of the blank.

7. A method as claimed in 1, wherein said steps of removing material are performed by a chemical etching technique.

8. A method as claimed in 2, wherein said steps of removing material are performed by a chemical etching technique.

9. A method as claimed in 1, in which the first and second portions are defined simultaneously in said step of removing material from selected portions of the surface layer of the blank.

10. A method as claimed in claim 9, further comprising the step of removing material from the other main surface of the blank in the region of the first portions, so as to isolate the first portions from each other, during said step of removing material from the other main surface in the region of the embedded portions.

11. A method as claimed in claim 2, wherein said step of firmly embedding includes the step of firmly embedding the second portions in a fixing material seleceted from the group consisting of silica-filled epoxy, glass and glass-ceramic materials.

12. A lead frame fabricated by the method claimed in claim 13.

13. A generally planar lead frame comprising: several leads each having a relatively robust portion and a contiguous, relatively fragile portion thinner and narrower than the robust portion, the fragile portion having a flat face; and a flat support in the plane of the lead-frame, all of the fragile portions being embedded in said flat support such only said flat face of each fragile portion is exposed in said plane for electrical contact, and each fragile portion is as wide at said flat face as it is beneath that flat face.

* * * * *